United States Patent [19]

Bergeron

[11] 4,412,308
[45] Oct. 25, 1983

[54] PROGRAMMABLE BIPOLAR STRUCTURES

[75] Inventor: David L. Bergeron, Winooski, Vt.

[73] Assignee: International Business Machines Corporation, Armonk, N.Y.

[21] Appl. No.: 273,520

[22] Filed: Jun. 15, 1981

[51] Int. Cl.$^3$ ............................................. G11C 17/06
[52] U.S. Cl. ...................................... 365/105; 365/96; 357/15
[58] Field of Search ................. 365/94, 96, 103, 104, 365/105; 357/15, 45

[56] References Cited

U.S. PATENT DOCUMENTS

| | | | |
|---|---|---|---|
| 3,525,020 | 5/1967 | Schmitz | 317/101 |
| 3,555,365 | 1/1971 | Forlani et al. | 317/101 |
| 3,641,516 | 2/1972 | Castrucci et al. | 365/105 |
| 3,717,852 | 2/1973 | Abbas et al. | 365/96 |
| 3,781,825 | 12/1973 | Bürker et al. | 365/105 |
| 4,070,654 | 1/1978 | Tachi | 365/104 |
| 4,112,505 | 9/1978 | Duval et al. | 365/96 |
| 4,145,702 | 3/1979 | Rau et al. | 357/45 |
| 4,152,627 | 5/1979 | Priel et al. | 315/227 |
| 4,153,949 | 5/1979 | Rau et al. | 357/45 |
| 4,287,569 | 9/1981 | Fukushima | 365/96 |

*Primary Examiner*—James W. Moffitt
*Attorney, Agent, or Firm*—Stephen J. Limanek

[57] ABSTRACT

A switchable bipolar structure, suitable for use in a programmable read only memory, is provided which includes a rectifying contact disposed on a N type semiconductor substrate with a P type diffusion region formed in the substrate spaced within a minority carrier diffusion length from the rectifying contact. A conductive filament is selectively formed between the rectifying contact and the P type diffusion region by applying a reverse bias voltage between the rectifying contact and the N type substrate having a magnitude sufficiently large so as to form a liquid alloy having a front moving in the direction of current flow. By maintaining the P type diffusion region at a positive voltage with respect to the voltage on the rectifying contact, the liquid alloy front moves from the rectifying contact to the P type diffusion region forming a conductive filament or segment therebetween. If the rectifying contact is aluminum and the semiconductor substrate is made of silicon, the filament becomes a silicide made of aluminum and silicon. By arranging the rectifying contact within a minority carrier diffusion length of, e.g., the base of a NPN transistor, a dense programmable read only memory system may be formed which is programmed by merely applying appropriate pulses of relatively low magnitude to the access lines of the memory system after the system has been fabricated. Alternatively, a dense Schottky barrier diode read only memory system may be provided by arranging a first rectifying contact within a minority carrier diffusion length of a P type diffusion region which is connected to a second rectifying contact of a Schottky barrier diode to selectively provide parallel current paths through the two rectifying contacts. In either embodiment, the presence or absence of the filament corresponds to the storing of a 0 or 1 binary digit of information in the memory systems.

39 Claims, 14 Drawing Figures

PROGRAMMABLE BIPOLAR STRUCTURES

TECHNICAL FIELD

This invention relates to integrated semiconductor circuits and structures, and more particularly to permanently switchable semiconductor structures and systems or arrays which may be used, e.g., in programmable read only memories.

BACKGROUND ART

Integrated semiconductor circuits and structures, particularly systems or arrays having simple structures or devices each of which represents a binary digit of information, as in read only memories (ROM) or in programmable read only memories (PROM) have achieved high device or cell densities.

In known bipolar PROM cells, a so-called fusible diode method is used to program the memory wherein an emitter-base junction of a device is reverse biased at a high current inducing metal to become locally heated, producing a short to the P type conductivity base region of the device. Some inherent disadvantages of this method include the need for high current to program the memory and for isolation around each cell. Furthermore, the junction between the base region and the epitaxial layer produces a relatively high capacitance which determines the delay of the memory cell. Other types of programmable structures and PROM cells are also well known.

In, e.g., U.S. Pat. No. 4,152,627, filed June 10, 1977, there is disclosed a PROM having cells which include a diode connected to a fusible link.

U.S. Pat. No. 3,525,020, filed May 15, 1967, illustrates a semiconductor matrix having NPN transistors connected to selected vertical and horizontal lines.

U.S. Pat. No. 4,070,654, filed Sept. 13, 1976, describes a ROM having an array of Schottky barrier diodes programmed by contact openings formed at predetermined locations in an insulating film with an aluminum strip extending over the openings.

In U.S. Pat. No. 3,555,365, filed May 29, 1968, there is disclosed a memory having an array of Schottky diodes wherein selected diodes are isolated by melting bridges with a current of substantial magnitude.

Commonly assigned U.S. Pat. No. 3,641,516, filed by P. P. Castrucci et al. on Sept. 15, 1969, and also U.S. Pat. No. 3,781,825, filed May 10, 1971, describe memories including programmable elements having two series-connected and opposed diodes. To effect programming, selected diodes operated at high reverse bias voltages are short circuited.

DISCLOSURE OF THE INVENTION

It is an object of this invention to provide an improved switchable structure which may be actuated in, e.g., a read only memory, after the memory has been fabricated.

It is another object of this invention to provide an improved programmable read only memory which is programmed at low power.

It is still another object of this invention to provide an improved programmable read only memory which requires only relatively small driver circuits for programming the memory.

It is yet another object of this invention to provide an improved high density, high performance programmable read only memory which is rapidly personalized.

It is a further object of this invention to provide an improved programmable read only memory which does not require extensive isolation regions and wherein the personalization is readily implemented.

In accordance with the teachings of this invention, a switchable structure, suitable for use in a programmable read only memory, is provided which includes a rectifying contact disposed on an N type semiconductor substrate with a P type diffusion region formed in the substrate spaced within a minority carrier diffusion length from the rectifying contact. A conductive filament is formed between the rectifying contact and the P type diffusion region by applying a reverse bias voltage between the rectifying contact and the N type substrate having a magnitude sufficiently large so as to form a liquid alloy having a front moving in the direction of current flow. By maintaining the P type diffusion region at a positive voltage with respect to the voltage on the rectifying contact, the liquid alloy front can be made to move from the rectifying contact to the P type diffusion region forming a conductive filament or segment therebetween. If the rectifying contact is aluminum and the semiconductor substrate is made of silicon, the filament becomes a silicide made of aluminum and silicon. By arranging the rectifying contact within a minority carrier diffusion length of, e.g., the base of an NPN transistor, a dense programmable read only memory system may be formed which is programmed by merely applying appropriate pulses of relatively low magnitudes to the access lines of the memory system after the system has been fabricated. Alternatively, a dense Schottky barrier diode read only memory system may be provided by arranging a first rectifying contact within a minority carrier diffusion length of a P type diffusion region which is connected to a second rectifying contact of a Schottky barrier diode to selectively provide parallel current paths through the two rectifying contacts. In each instance, the presence or absence of the filament corresponds to the storing of a 0 or 1 binary digit of information in the memory systems.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
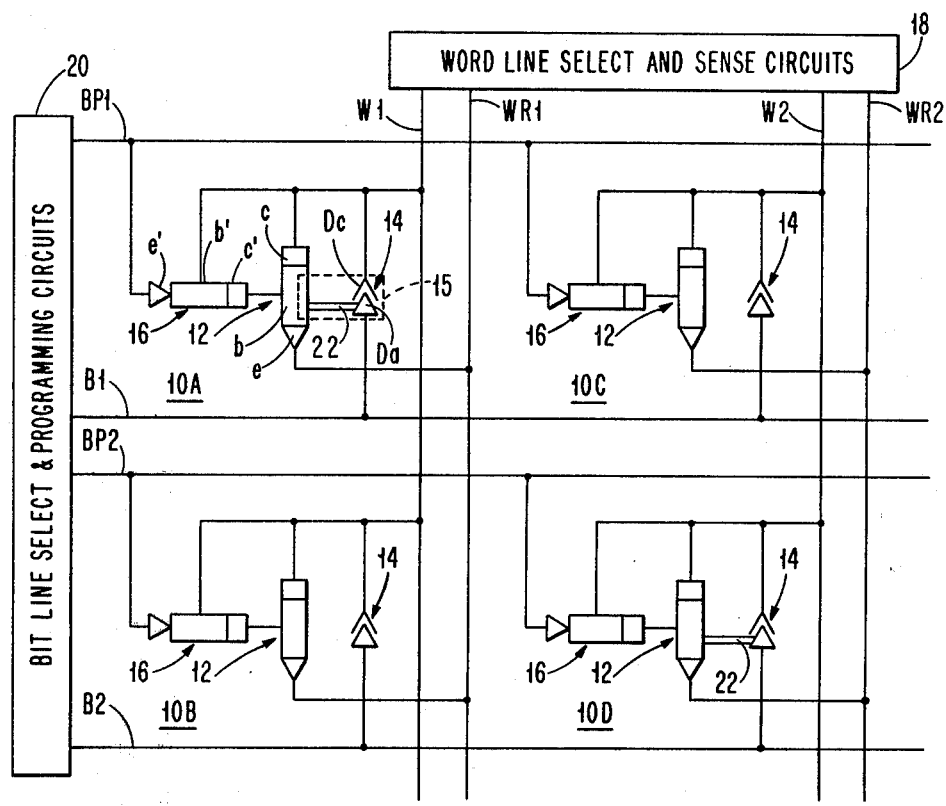
FIG. 1 illustrates a programmable read only memory system having NPN transistor cells.

Referring to the drawings in more detail, there is shown in FIG. 1 the programming read only memory system of the present having an array with four memory cells 10A, 10B, 10C and 10D. Each of the cells, such as cell 10A, includes an NPN transistor 12 having a collector c, a base b and an emitter e and a Schottky barrier diode 14 having an anode Da and a cathode Dc with its anode Da disposed adjacent to the base of the NPN transistor 12 and a PNP transistor 16 having a collector c'; a base b' and an emitter e', with its collector connected to the base of the NPN transistor 12. A programming node is indicated in cell 10A by a dashed line box 15.

A first word line W1 is connected to the collector of the NPN transistor 12, the cathode of the Schottky barrier diode 14 and the base of the PNP transistor 16 of each of the memory cells 10A and 10B. A second word line W2 is connected to the collector of the NPN transistor 12, the cathode of the Schottky barrier diode 14 and the base of the PNP transistor 16 of the memory cells 10C and 10D. A first word read line WR1 is connected to the emitter of the NPN transistor of each of the memory cells 10A and 10B and a second word read line WR2 is connected to the emitter of the NPN transistor 12 of each of the memory cells 10C and 10D. A first bit line B1 is connected to the anode of the Schottky barrier diode of each of the memory cells 10A and 10C and a second bit line B2 is connected to the anode of the Schottky barrier diode 14 in each of the memory cells 10B and 10D. A first bit programming line BP1 is connected to the emitter of the PNP transistor 16 of each of the memory cells 10A and 10C and a second bit programming line BP2 is connected to the emitter of the PNP transistor 16 of each of the memory cells 10B and 10D. The first and second word lines W1 and W2 and the first and second word read lines WR1 and WR2 are connected to conventional word line select and sense circuits 18. The first and second bit lines B1 and B2 and the first and second bit programming lines BP1 and BP2 are connected to conventional bit line select and programming circuits 20. A conductive filament or segment 22 disposed between the base of the NPN transistor 12 and the anode of the Schottky barrier diode 14 connects the base of transistor 12 of cell 10A to the first bit line B1 and of cell 10D to the second bit line B2.

Figure 4:
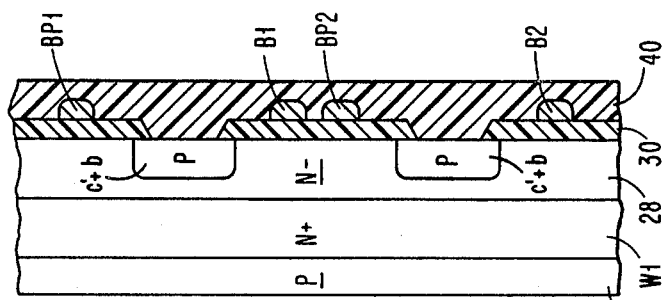
FIG. 4 is a sectional view of the memory array illustrated in FIG. 2 of the drawings taken through line 4—4.
Figure 2:
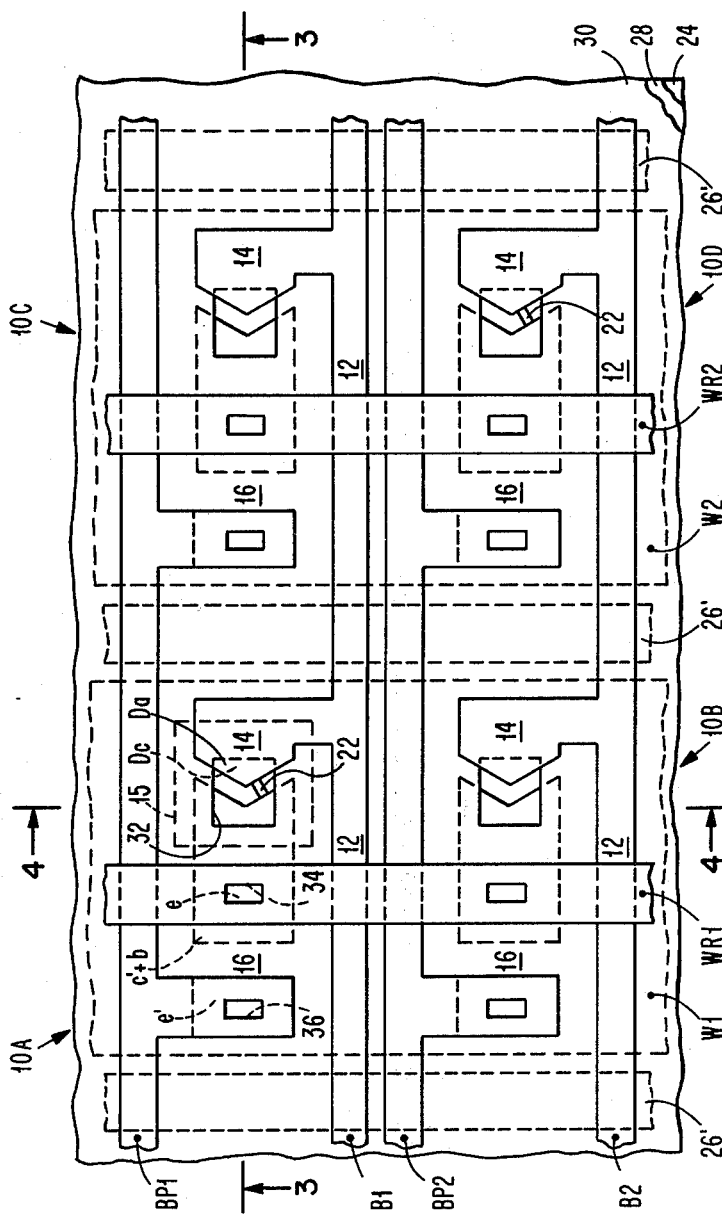
FIG. 2 is a plan view of the array of the system illustrated in FIG. 1 of the drawings.
Figure 3:
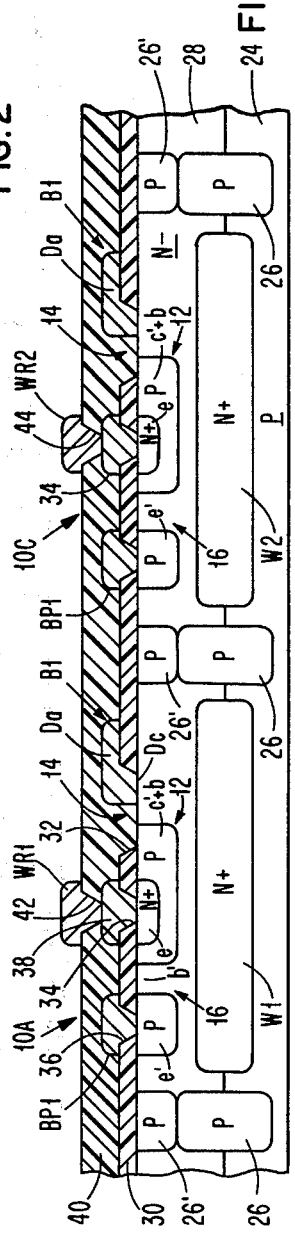
FIG. 3 is a sectional view of the array illustrated in FIG. 2 of the drawings taken through line 3—3.

The array of the memory system of FIG. 1 is illustrated in more detail in FIGS. 2, 3 and 4 of the drawings, with FIG. 2 being a plan view, FIG. 3 being a sectional view taken through line 3—3 of FIG. 2 and FIG. 4 being a sectional view taken through lines 4—4 of FIG. 2.

The array illustrated in FIGS. 2, 3 and 4 shows the four memory cells, 10A, 10B, 10C and 10D and the appropriate access lines necessary for writing and reading the cells. The memory array has a semiconductor substrate 24 preferably made of silicon and being of P type conductivity with N+ diffusion regions disposed at the surface thereof to form the first and second word lines W1 and W2. P type conductivity regions 26 are also formed at the surface of the substrate 24 for isolation purposes. An N− type epitaxial layer of silicon is deposited over the substrate 24 with the N+ diffusion region word lines W1 and W2 and the P type diffusion regions 26 extending into the N− type epitaxial layer 28 during subsequent processing steps as indicated more clearly in FIG. 3 of the drawings. At the surface of the N− type epitaxial layer 28 there are formed P type diffusion regions for the emitters e' of the PNP transistors 16, and for the collector of the PNP transistors and the base of the NPN transistor 12, indicated at c' and b, and isolation regions 26' which contact the isolation regions 26 in the lower portion of the epitaxial layer 28. An N+ region forming the emitter e of the NPN transistors 12 is disposed within the diffusion regions c' and b for each of the cells 10A, 10B, 10C and 10D. A layer of silicon dioxide 30 is formed over the surface of the N− type epitaxial layer 28 with openings 32, 34 and 36 formed therein. The opening 32 is formed so as to expose the surface of the P type region c' and b and to extend over the surface of the N− epitaxial layer 28, the opening 34 is formed over the emitter region e of the NPN transistor 12 and the opening 36 is formed over the emitter region e' of the PNP transistor 16. After the openings 32, 34 and 36 are formed in the silicon dioxide layer 30, metal lines, preferably made of copper doped aluminum or, if desired, of nickel or platinum, are deposited and formed so as to provide the bit lines B1 and B2 and the bit programming lines BP1 and BP2, as well as an electrode 38 in contact with the emitter region e of the NPN transistor 12 through opening 34. The bit lines B1 and B2 are disposed in contact with the surface of the N− type epitaxial layer 28 through opening 32 so as to form the Schottky barrier diodes 14 having an anode Da and a cathode Dc. The first and second bit programming lines BP1 and BP2 are disposed so as to be in contact with the emitter of the PNP transistors 16 through the openings 36 of the silicon dioxide layer 30. A suitable passivating or dielectric layer, 40, e.g., quartz or polyimide, is then deposited over the resulting structure with aperatures, such as 42 and 44, illustrated in FIG. 3, formed therein over the electrodes 38 of each of the cells 10A, 10B, 10C and 10D. The word read lines WR1 and WR2, which are also preferably made of copper doped aluminum, are then formed over the passivating layer 40, indicated only in FIGS. 3 and 4 of the drawings, in contact with the electrodes 38 through the openings such as 42 and 44. The programming node is indicated at dashed line box 15 in cell 10A.

Figure 5:
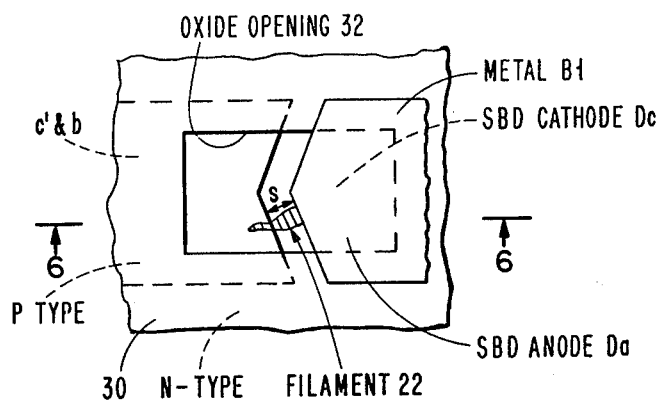
FIG. 5 is a plan view of an enlarged segment of a cell of the array illustrating a programming node in FIG. 2 of the drawings.
Figure 6:
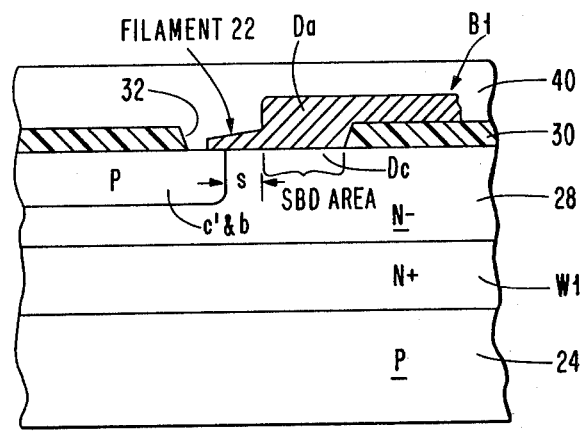
FIG. 6 is a sectional view of the segment illustrated in FIG. 5 of the drawings taken through line 6—6.

In FIGS. 5 and 6 of the drawings, there are illustrated enlarged views of the programming node 15 of the memory cell 10A to more clearly illustrate the arrangement and formation of the conductive filament or segment 22 and the spacing S between the Schottky barrier diode anode Da and the NPN transistor base c' and b, with FIG. 5 being a plan view and FIG. 6 being a sectional view taken through line 6—6 of FIG. 5. It should be noted that the adjacent edges of the Schottky barrier anode Da and the NPN transistor diffusion region c' and b are made in the form of a V having a uniform spacing S therebetween, with the filament 22 being capable of being formed at any point between these adjacent edges.

Figure 7:
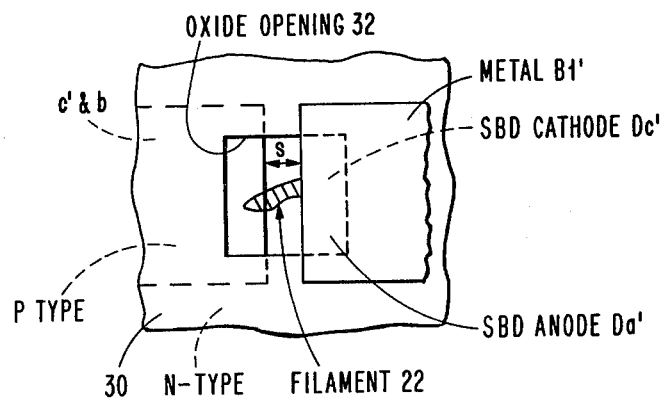
FIG. 7 is a plan view of a segment similar to that illustrated in FIG. 5 but with a somewhat different geometrical configuration.

FIG. 7 is a plan view of another embodiment of the programming node of the cells wherein the edges of the anode Da and the diffusion c' and b adjacent to each other are straight and parallel and spaced at a distance S. It should be noted that the maximum spacing S is equal to or preferably less than the minority carrier diffusion length of the diffusion material, for example, of arsenic when used in the N— epitaxial layer 28.

Figure 8:
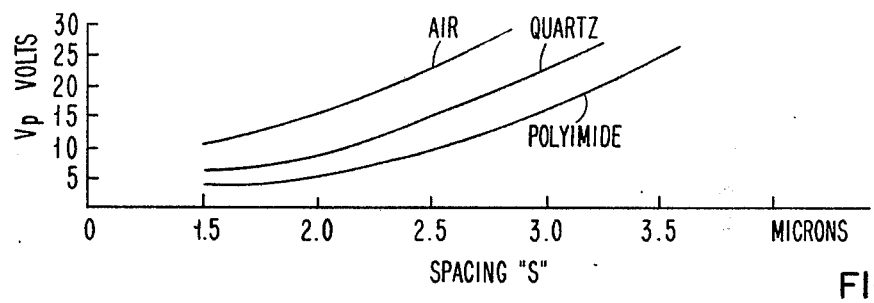
FIG. 8 are graphs indicating the relationship between a design spacing and voltage for programming the cells illustrated in FIG. 1 of the drawings.

In FIG. 8, there are shown graphs indicating the programming voltages $V_P$ required for spacings S when quartz and polyimide are used as the passivating layers, as well as the voltages $V_P$ required when the surface of the N— epitaxial layer 26 is exposed to the atmosphere or air. From a study of the graphs of FIG. 8 it can be seen that relatively low voltages are required to produce the filament 22. When the passivating layer, such as 40 in FIG. 3 is polyimide, a very low voltage, e.g., 5 to 10 volts, may be used to produce the filament 22, although approximately 17 volts has been found to consistently produce a desired filament without degrading the Schottky barrier diode. It can be readily seen from the graph that when the spacing S is at 2.0 microns and the passivating layer is polyimide, a voltage of approximately only five volts applied between the anode Da and the P region c' and b is required to produce the filament 22, whereas a voltage of about eight voltages is required for a quartz passivating layer and more than 10 volts is required to produce the filament 22 when the structure is exposed to air. In general, a layer such as polyimide, which traps heat more readily than other insulating layers will produce the filament 22 at lower voltages. The filament has a width of approximately 1 micron or more and has been found to contain aluminum and copper when the diode anode Da is made of copper doped aluminum. Also, the filament has been found to contain silicon which is derived from the surface of the N— epitaxial layer 28, thus forming a silicide connection between the diode Da and the base region c' and b of the NPN transistor 12. The filament 22 forms by localized Joule heating, to approximately 600° C., resulting in an aluminum-silicon-copper liquid alloy having a front that moves in the direction of the current flow from the anode Da to the base of the NPN transistor 12 until the voltage pulse or train of pulses is terminated.

Figure 9:
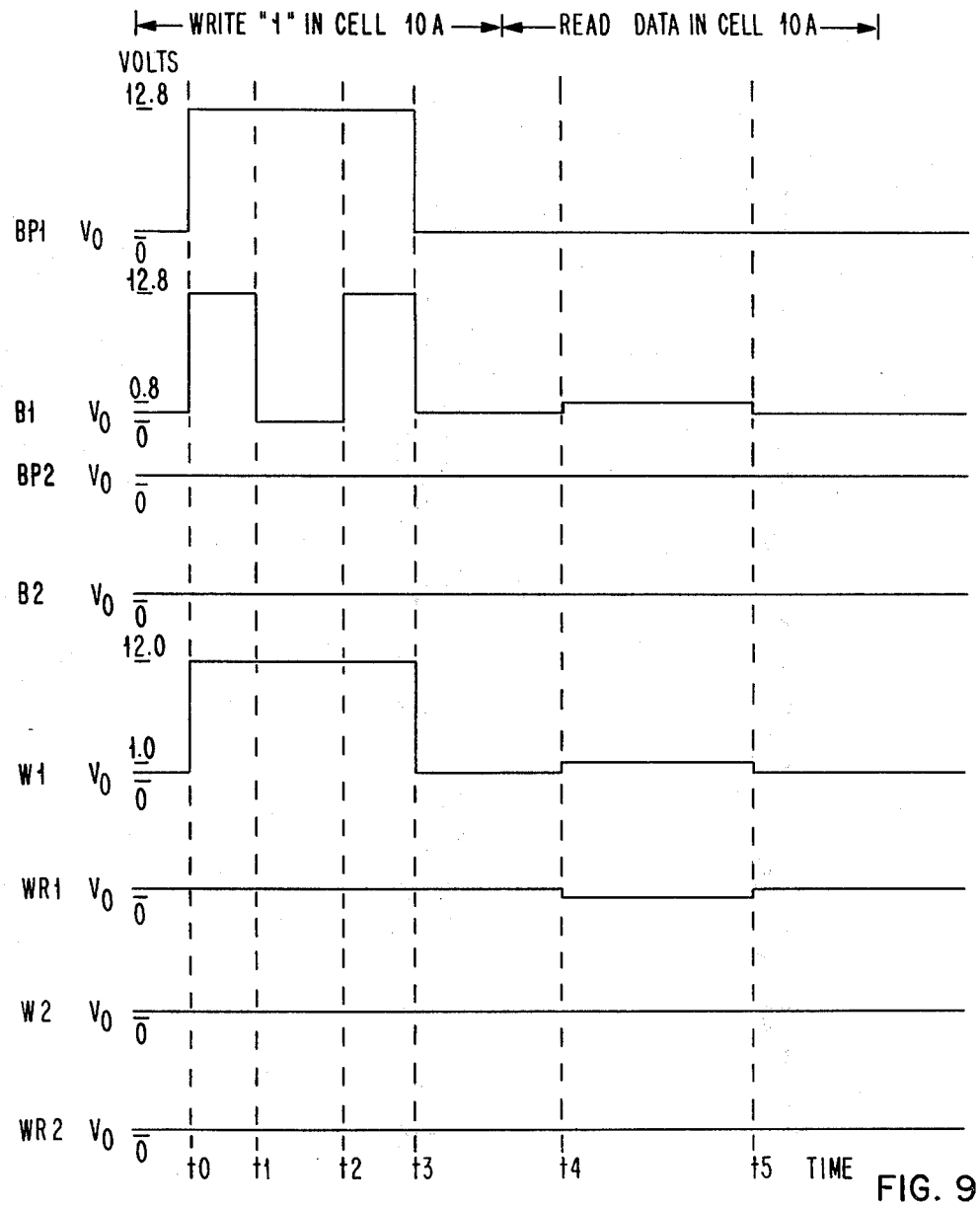
FIG. 9 is a pulse program which may be used for operating the memory system illustrated in FIG. 1 of the drawings.

In order to better understand the operation of the NPN programmable read only memory system illustrated in FIG. 1 of the drawings, reference may be had to the pulse program shown in FIG. 9 of the drawings indicating a programming or write cycle between times t0 and t3 and a read cycle between times t3 and t5 for cell 10A. After the array of the memory system has been fabricated and before the system has been programmed, the first and second bit programming lines BP1 and BP2 are held at 0 volts or ground, whereas the first and second word read lines WR1 and WR2, the first and second bit lines B1 and B2 and the first and second word lines W1 and W2 are permitted to float at any voltage between ground and the supply voltage of, say 12.8 volts, as indicated prior to time t0 in FIG. 9. At this point, none of the filaments 22 have been formed in the array and, therefore, all of the memory cells 10A, 10B, 10C and 10D store a 0 binary digit of information. To write a one digit of binary information into cell 10A, that is, to form the filament 22 between the anode Da of diode 14 and the base of the NPN transistor 12, the voltage on the word line W1 is increased to 12 volts and the voltage on the bit line B1 and on the bit programming line BP1 is increased to 12.8 volts, while the voltage on the first word read line WR1 continues to float, as indicated at time t0 in FIG. 9. Since 12.8 volts are applied to the emitter e' of the PNP transistor 16 and 12 volts have been applied to the base of the PNP transistor 16, transistor 16 tends to turn on, applying a voltage of nearly 12.8 volts to the base of the NPN transistor 12. With +12 volts on the cathode DC of the diode 14, the voltage on the anode Da of the diode 14 is reduced from 12.8 volts to 0 volts at time t1 to reverse bias the diode 14 providing a differential voltage between the cathode Dc and the anode Da of diode 14 of approximately 12 volts which passes a current of about 200 microamperes through the diode 14 producing localized Joule heating up to about 600° C. at the anode Da resulting in the formation of an aluminum silicon liquid alloy front with the diode 14 in deep avalance. Since the voltage on Da is at zero volts and the voltage on the base of the transistor 12, located within a minority carrier diffusion length of Da, is about 12.8 volts, the liquid front moves from the anode Da to the base of the transistor 12 in the direction of current flow. Thus, the filament 22 is produced between the anode Da of the diode 14 and the base of the NPN transistor 12. With the formation of the filament 22, the base of the transistor 12 of cell 10A is now connected to the first bit line B1 storing a 1 binary digit, whereas all cells storing a 0 binary digit of information have only the Schottky barrier diode 14 connected to the bit line. At time t2 the current through the diode 14 is turned off by raising the voltage on the first bit line B1, and then at time t3 the first bit line B1 is permitted to again float between ground and +12.8 volts, with the write cycle being completed by lowering the voltage on the bit programming line BP1 and on the first word line W1 to 0 volts. Any other cell in the array may be programmed so as to store a 1 binary digit of information in the manner described hereinabove in connection with the programming of the cell 10A. For example, to program with the cell 10D to store a 1 digit of binary information similar voltages are applied to the second word line W2, the second bit line B2 and the second bit programming line BP2 to produce the filament 22 indicated in the cell 10D of FIG. 1 of the drawings.

To now read the 1 binary digit of information stored in the cell 10A, a voltage of +1 volt is applied to the first word line W1, and a voltage of +0.8 volts is applied to the first bit line B1, with the first word read line WR1 being grounded, as indicated in the read cycle shown in FIG. 9. Since this combination of voltages turns on the NPN transistor 12, current flow may be readily detected in the first word line W1. It can be seen that if these same voltages are applied to a cell which does not have a 1 binary digit stored therein, the NPN transistor 12 will not turn on, nor will current flow through the Schottky barrier diode since the Schottky barrier diode will have only a small reverse bias voltage applied thereto insufficient to pass current.

It can be seen that the cells of the present invention operate at bipolar speeds and require very little surface area on the semiconductor substrate. Furthermore, since isolation regions 26, 26' are required only for the word lines, a very dense, high performance programmable read only memory has been provided by the present invention.

Figure 10:
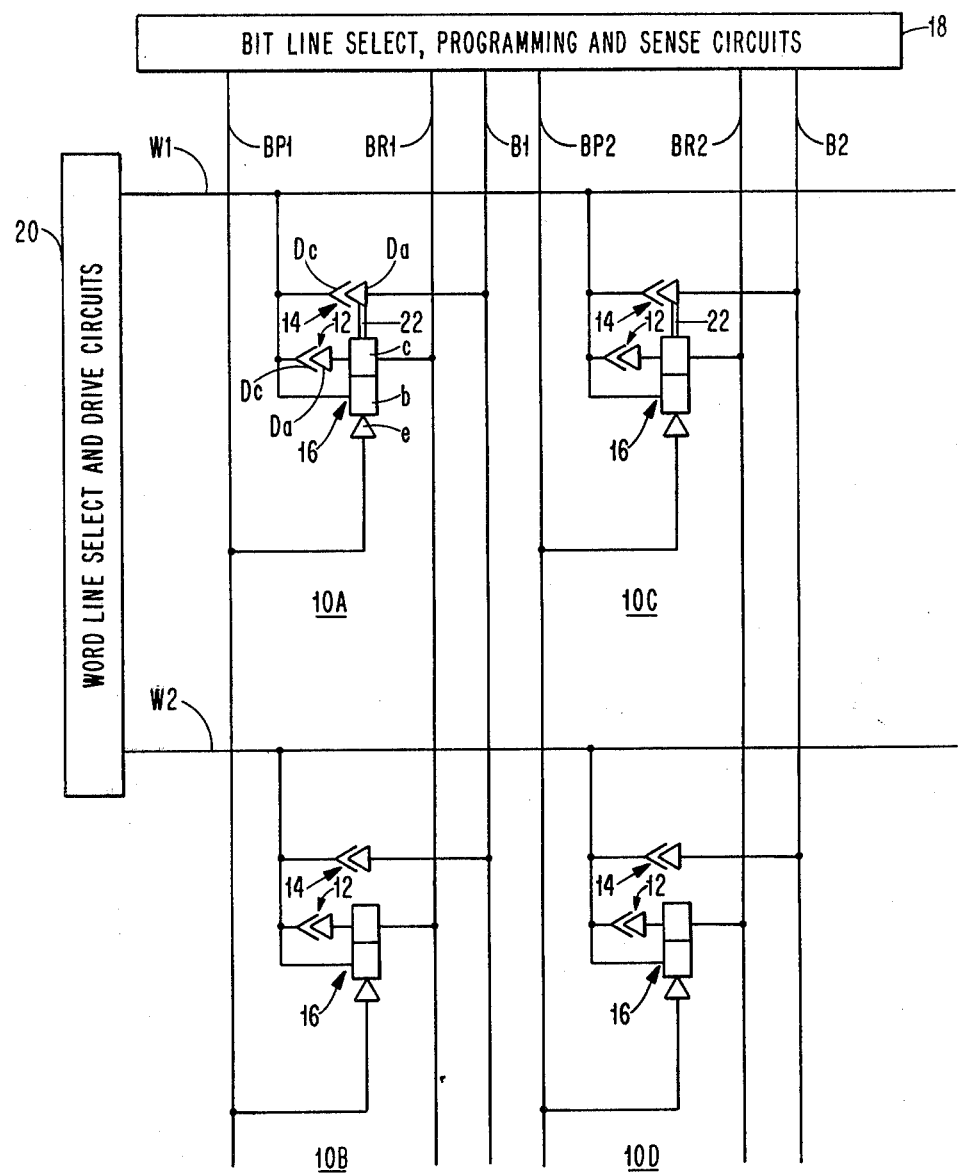
FIG. 10 is a programmable read only memory system using Schottky barrier diode memory cells.

Another embodiment of the memory system of the present invention is illustrated in FIG. 10 of the drawings having an array with memory cells 10A, 10B, 10C and 10D, wherein each of the cells includes a pair of Schottky diodes having their anodes selectively interconnected to represent a 1 one digit of binary information. As shown in FIG. 10, cell 10A includes a first Schottky barrier diode 12 having an anode connected to a first bit read line BR1 and a cathode Dc connected to a first word line W1. A second Schottky barrier diode 14 has its anode Da connected to a first bit line B1 and its cathode Dc connected to the first word line W1. A PNP transistor 16 has its emitter e connected to a first bit programming line BP1, its base b connected to the first word line W1 and its collector c connected to the first bit read line BR1. Cell 10B is similarly connected to the first bit line B1, the first bit read line BR1 and the first bit programming line BP1 but is connected to a second word line W2 rather than to the first word line W1. Cells 10C and 10D are connected in a similar manner to a second bit line B2, a second bit read line BR2, and a second bit programming line BP2, with cell 10C being connected to the first word line W1, and the cell 10D being connected to the second word line W2. The first and second bit lines B1 and B2, the first and second bit programming lines BP1 and BP2 and the first and second bit read lines BR1 and BR2 are connected to known bit line select, programming and sense circuits 18, with the first and second word line W1 and W2 being connected to known word line select and drive circuits 20.

Figure 13:
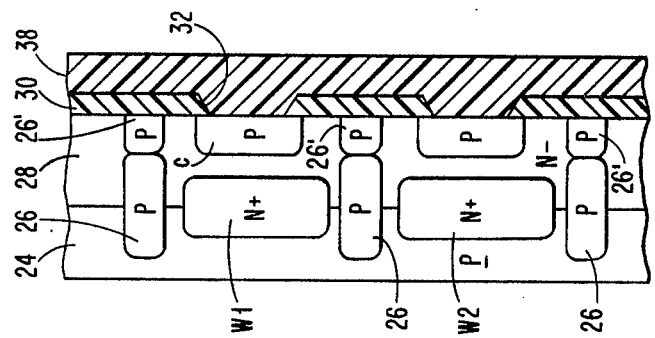
FIG. 13 is a sectional view of the memory array illustrated in FIG. 11 of the drawings taken through line 13—13.
Figure 11:
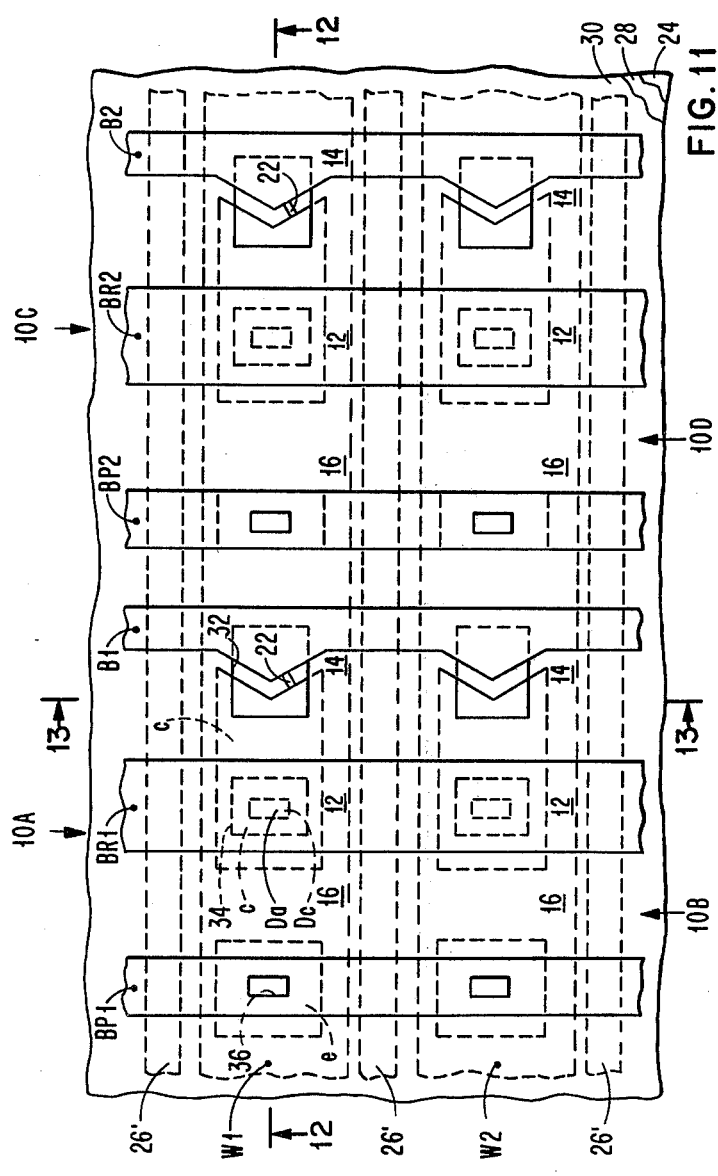
FIG. 11 is a plan view of the memory array illustrated in FIG. 10 of the drawing.
Figure 12:
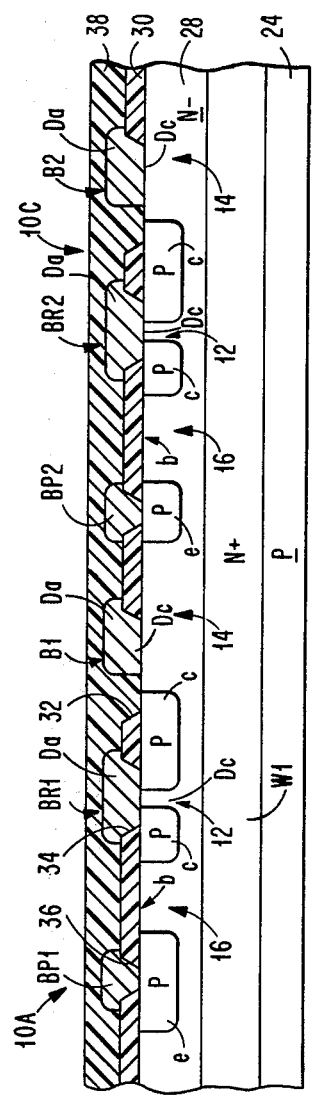
FIG. 12 is a sectional view of the memory illustrated in FIG. 11 of the drawings taken through line 12—12.

The array of the memory system illustrated in FIG. 10 is shown in more detail in FIGS. 11, 12 and 13 of the drawings, wherein FIG. 11 is a plan view, FIG. 12 is a sectional view of FIG. 11 taken through line 12—12 and FIG. 13 is a sectional view of FIG. 11 taken through line 13—13. As illustrated in FIGS. 11, 12 and 13, the memory array includes a semiconductor substrate 24, preferably made of silicon and being of P type conductivity. N+ diffusion regions are formed at the upper surface of the semiconductor substrate 24 to form the first and second word lines W1 and W2 and P regions 26, used for word line isolation purposes, are formed parallel to the word lines W1 and W2. An N+ type conductivity epitaxial layer 28 is then deposited over the substrate 24 wherein by outdiffusion during the hot process steps there is formed extensions of the N+ regions for word lines W1 and W2 and extensions of the isolation region 26 at the lower portion of the epitaxial layer 28, as indicated more clearly in FIG. 13 of the drawings. At the upper surface of the epitaxial layer 28, there is formed a plurality of P type conductivity regions, regions e being the emitters of the PNP transistors 16, regions c being the collectors of the PNP transistors 12 and isolation regions 26' extending so as to contact regions 26 to complete the isolation of the word lines W1 and W2. A thin insulating layer 30, preferably made of silicon dioxide, has opening 32, 34 and 36, with openings 32 being located so as to expose the surface of the P regions forming the collectors c of the PNP transistor 16 and extending over the N— epitaxial layer 28, openings 34 being located so as to expose the surface of the N— epitaxial layer 28 which is surrounded by the P regions of collectors c of the PNP transistors 16 and the openings 36 being formed over the emitter regions e of the PNP transistors 16. A metallic layer, preferably copper doped aluminum, is then deposited over the thin silicon dioxide layer 30 and the lines BP1, BR1 and B1 are etched therefrom. The first bit programming line BP1 is contacted to the emitters e of the PNP transistors 16 of the cells 10A and 10B, the first bit read line BR1 forms Schottky barrier diodes 12 with the N— epitaxial layer 28 defined by the collectors of the PNP transistors 16 of cells 10A and 10B and extends over the P regions of collectors c of the PNP transistors 16 of cells 10A and 10B and the first bit line B1 forms Schottky barrier diodes 14 with the N— epitaxial layer 28 within the opening 32 of the insulating layer 30 in cells 10A and 10B. The Schottky barrier diodes 12 and 14 each have an anode Da and a cathode Dc with the anode Da of diode 14 being spaced within a minority carrier diffusion length of the collector c of the PNP transistor 16. A passivating layer 38, shown only in FIGS. 12 and 13, which may be, for example, quartz or polyimide, is deposited over the top of the entire structure.

Figure 14:
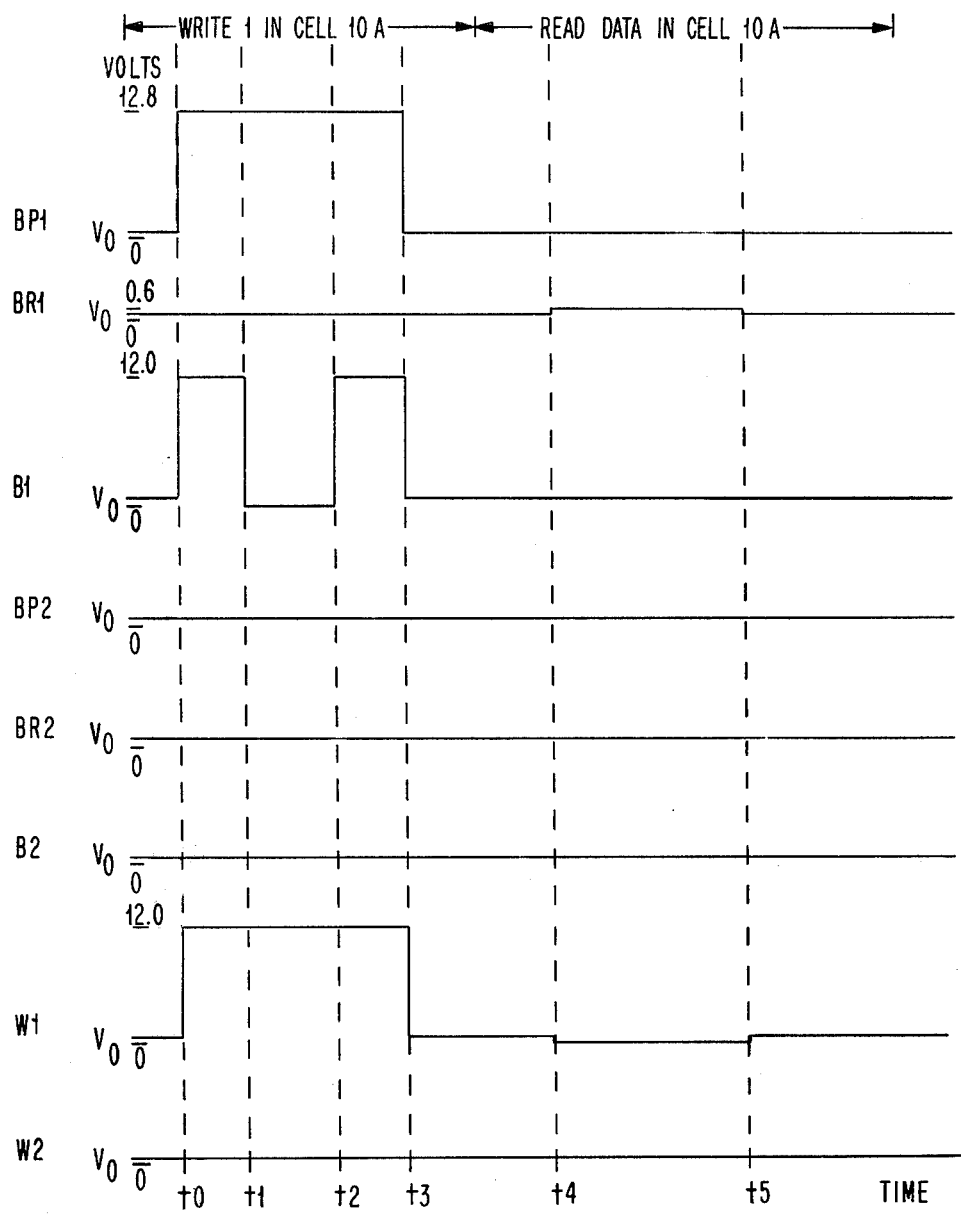
FIG. 14 is a pulse program for operating the memory system illustrated in FIG. 10 of the drawings.

To better understand the operation of the memory system illustrated in FIG. 10 of the drawings, reference may be had to the pulse program shown in FIG. 14 of the drawings which indicates a write cycle for writing a 1 digit of binary information into the cell 10A and a read cycle for reading information from cell 10A of the system of FIG. 10 Prior to time t0, all of the cells of the array may be considered to have a 0 binary digit of information stored therein and all of the lines of the memory system are either at zero or ground potential or are in an open condition. To write a one digit of binary of information into the cell 10A, the voltage on the first word line W1 and on the first bit line B1 is increased to 12 volts and the voltage on the first bit programming line BP1 is increased to 12.8 volts, as indicated at time t0 in FIG. 14. With these voltages it can be seen that the PNP transistor has 12.8 volts on its emitter and 12 volts on its base b which tends to turn on the PNP transistor 16 to provide a voltage of almost 12.8 volts on the collector c of transistor 16. Furthermore, at this point it can be seen that the first Schottky barrier diode 12 has a forward bias voltage applied thereto of approximately 0.8 volts. At time t1, the voltage on the first bit line B1 is reduced to zero volts providing a reverse bias of 12 volts across the second Schottky barrier diode 14. Again, this voltage is sufficient to produce the filament 22 between the anode Da of the second Schottky barrier diode and the collector c of the PNP transistor 16 To terminate the current flow through the second Schottky barrier diode 14, the voltage on the first bit line B1 is again increased to 12.8 volts at time t2, and then at time t3 the bit line B1 is permitted to float at a substantially lower voltage, as indicated at time t3.

To read the information from cell 10A, the first bit read line BR1 has applied thereto a voltage of 0.6 volts and the voltage on the first word line W1 is decreased to 0 volts or ground potential. With this arrangement, it can be seen that current flows through both diodes 12 and 14 since each of these diodes has a forward bias voltage of 0.6 volts applied thereto. The current in the first bit read line BR1 can then be read by the appropriate sense circuits 18 to indicate the presence of a one digit of binary information stored in memory cell 10A To form the filament 22 in cell 10C, a pulse program is used which is similar to that indicated between times t0 and t3 in FIG. 14 of the drawings. It should be noted that when the filament 22 is not formed in a memory cell, such as cells 10B and 10D, only one diode is located between the bit read line and the word line and, therefore, during the read cycle a substantially lower current is detected in the sense circuit 18. It should also be noted that in the system illustrated in FIG. 10 of the drawings, a plurality of cells coupled to a word line may be read out simultaneously.

Although only a simple 2×2 array has been shown for purposes of clarity in the systems of FIGS. 1 and 10, it should be understood that the array may include 50–100 word lines and each of the word lines may have coupled thereto 50–100 cells.

Accordingly, it can be seen that in accordance with the teachings of the present invention a programmable structure is provided which may be used in programmable read only memories having cells each of which includes an NPN transistor or a Schottky barrier diode, along with a PNP programming transistor which is highly integrated. Also, it should be noted that a very dense, high preformance programmable memory system has been provided which may be made in a very simple manner with isolation regions required only between the word lines. Furthermore, the entire memory system may be made by the manufacturer, stock piled and then programmed with low voltages and low currents by the user at his convenience.

While the invention has been particularly shown and described with reference to preferred embodiments thereof, it will be understood by those skilled in the art that various changes in form and details may be made therein without departing from the spirit and scope of the invention.

What is claimed is:

1. A switchable structure comprising;
    a rectifying contact disposed on an N type semiconductor substrate forming a Schottky diode between said contact and said substrate,
    a P type diffusion region disposed in said substrate and spaced within a minority carrier diffusion length from said rectifying contact,
    means for applying a potential to said region more positive than the potential at said contact, and
    means for applying a reverse bias between said rectifying contact and said N type substrate to produce a conductive filament between said contact and said region.

2. A switching structure as set forth in claim 1 wherein said rectifying contact includes aluminum and said substrate is silicon.

3. A switchable structure comprising;
    a semiconductor substrate having an N type region and a P type region,
    a rectifying contact disposed on said N type region and spaced within a minority carrier diffusion length from said P type region,
    means for applying a voltage to said P type region having a more positive value that the voltage at said contact, and
    means for applying a reverse bias voltage between said rectifying contact and said N type region having a magnitude sufficient to produce a conductive filament between said contact and said P type region.

4. A switchable structure as set forth in claim 3 wherein said structure further includes a dielectric layer disposed on said N type substrate between said rectifying contact and said P typed diffusion region.

5. A switchable structure as set forth in claim 4 wherein said voltage applying means includes a PNP transistor.

6. A switchable structure as set forth in claim 5 wherein said rectifying contact is made of aluminum, said substrate is made of silicon and said dielectric layer is made of polyimide.

7. A switchable structure as set forth in claim 6 wherein said rectifying contact is disposed within 20 microns of said P type regions.

8. A switchable structure as set forth in claim 7 wherein said reverse bias voltage applying means applies a positive voltage to said N type region and a substantially zero voltage to said rectifying contacts.

9. A switchable structure as set forth in claim 8 wherein said positive voltage has a magnitude sufficiently large so as to produce Joule heating at said rectifying contact.

10. A switchable structure as set forth in claim 9 wherein said positive voltage has a magnitude sufficiently large so as to produce a temperature of approximately 600° C. at said rectifying contact.

11. A switchable structure as set forth in claim 4 further including a transistor and wherein said P type region is a portion of said transistor.

12. A switchable structure as set forth in claim 11 wherein said P type region is the base of said transistor.

13. A switchable structure as set forth in claim 4 further including a diode having its anode connected to said P type region.

14. A switchable structure as set forth in claim 13 wherein said diode is a Schottky barrier diode.

15. A programmable system comprising;
    a circuit having a plurality of taps and a common point and a plurality of switchable structures disposed between said taps and said common point, each of said structures including a rectifying contact disposed on an N type semiconductor substrate forming a Schottky diode between said contact and said substrate and a P type diffusion region formed in said substrate spaced within a minority carrier diffusion length from said contact, said region being at a more positive voltage than the voltage at said contact, and
    means for applying a reverse bias voltage between at least one of said rectifying contacts and said N type semiconductor substrate to produce a conductive filament between said one contact and its associated region.

16. A programmable system as set forth in claim 15 wherein said rectifying contacts are made of aluminum and said substrate is made of silicon.

17. A programmable system as set forth in claim 16 wherein said rectifying contact is disposed within 20 microns of said P type region.

18. A programmable system as set forth in claim 16 wherein said reverse bias voltage applying means applies a positive voltage to said N type semiconductor substrate and a substantially zero voltage to said rectifying contacts.

19. A programmable read only memory comprising;
    a storage device having a junction disposed between a first N type semiconductor region and a P type semiconductor region,
    a Schottky barrier diode having an anode and a cathode, said anode being a rectifying contact disposed on a second N type semiconductor region and within a minority carrier diffusion length of said P type region, the voltage on said anode being substantially less positive than the voltage on said P type semiconductor region,
a first access line connected to said cathode and to said first N type region,
a second access line connected to said anode,
means connected to said first and second access lines for applying a reverse bias voltage to said diode to produce a conductive filament between the anode of said diode and said P type region, and
means coupled to said junction for determining current flow at said junction.

20. A programmable read only memory as set forth in claim 19 further including a transistor and wherein said first N type semiconductor region is the collector of said transistor and said P type semiconductor region is the base of said transistor.

21. A programmable read only memory as set forth in claim 19 further including a second diode and wherein said second diode inlcudes said junction.

22. A programmable read only memory as set forth in claim 21 wherein said second diode is a Schottky barrier diode.

23. A programmable read only memory as set forth in claim 19 further incuding means for applying a substantially constant voltage to said P type semiconductor region and a dielectric layer disposed on said second N type semiconductor region between said anode and said P type semiconductor region.

24. A programmable read only memory as set forth in claim 23 wherein said constant voltage applying means includes a PNP transistor and said dielectric layer is made of quartz.

25. A programmable read only memory comprising;
a plurality of word lines,
a plurality of bit lines, and
an array of storage cells, each cell being connected between a respective one of said word lines and one of said bit lines and each cell including a rectifying contact disposed on an N type semiconductor substrate forming a diode between said contact and said substrate and a P type diffusion region formed in said substrate spaced within a minority carrier diffusion length from said contact, and
means for applying a reverse bias voltage between selected contacts of said rectifying contacts and said N type semiconductor substrate to produce conductive filaments between said selected contacts and their associated P type diffusion regions.

26. A programmable read only memory as set forth in claim 25 further including means for applying a voltage to said P type diffusion region and a passivating layer disposed on said N type substrate between said rectifying contact and said P type diffusion region.

27. A programmable read only memory as set forth in claim 26 wherein the reverse bias voltage is from 5 to 30 volts and said passivating layer is made of polyimide.

28. A programmable read only memory as set forth in claim 27 wherein said P type diffusion region is spaced within 20 microns of said rectifying contact.

29. A programmable read only memory comprising;
a plurality of conductive word lines,
a plurality of word read lines,
a plurality of conductive bit lines,
an array of storage cells, each of said cells being connected to a respective one of said conductive word lines, of said word read lines and of said bit lines and each cell including a Schottky barrier diode having a rectifying contact disposed on an N type semiconductor substrate, said diode being connected between a respective conductive word line and a respective conductive bit line and an NPN transistor having a base region disposed within said substrate and spaced within a minority carrier diffusion length from said rectifying contact, said NPN transistor being connected between a respective conductive word line and respective word read line, and
means for applying a reverse bias voltage between the rectifying contact and said N type semiconductor substrate of a selected cell to produce a conductive filament between said contact and said base region.

30. A programmable read only memory as set forth in claim 29 further including a plurality of bit programming lines and means incuding one of said bit programming lines for applying a voltage to the base of the transistor of said selected cell.

31. A programmable read only memory as set forth in claim 30 wherein said voltage applying means includes a PNP transistor and applies a positive voltage to said base region with respect to the voltage on said rectifying contact.

32. A programmable read only memory as set forth in claim 29 wherein said rectifying contacts are made of a given conductive element and said filaments include said element.

33. A programmable read only memory as set forth in claim 32 wherein said conductive element includes aluminum.

34. A programmable read only memory comprising;
a plurality of word lines,
a plurality of conductive bit lines,
an array of storage cells, each of said cells being connected to a respective one of said word lines and said conductive bit lines and each cell including a Schottky barrier diode having a rectifying contact disposed on an N type semiconductor substrate and spaced within a minority carrier diffusion length of a P type region formed in said substrate, said diode being connected between a respective word line and a respective conductive bit line and a second diode connected between said word line and said P type region, and
means for applying a reverse bias voltage between the rectifying contact and said N type region of a selected cell to produce a conductive filament between said contact and P type region of said selected cell.

35. A programmable read only memory as set forth in claim 34 further including a plurality of bit programming lines and means including a respective bit programming line for applying a voltage to said P type region of said selected cell.

36. A programmable read only memory as set forth in claim 35 wherein said voltage applying means includes a PNP transistor, said P type region being the collector of said transistor.

37. A programmable read only memory as set forth in claim 36 further including a plurality of bit read lines and means including a respective one of said bit read lines for reading said selected cell.

38. A programmable read only memory as set forth in claim 34 wherein said rectifying contacts are made of a given conductive element and said filaments include said element.

39. A programmable read only memory as set forth in claim 38 wherein said conductive element includes aluminum.

* * * * *